(12) United States Patent
Takabatake et al.

(10) Patent No.: US 11,276,550 B2
(45) Date of Patent: Mar. 15, 2022

(54) CHARGED PARTICLE BEAM DEVICE

(71) Applicant: Hitachi High-Tech Corporation, Tokyo (JP)

(72) Inventors: Mari Takabatake, Tokyo (JP); Kazuyuki Hirao, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/082,678

(22) Filed: Oct. 28, 2020

(65) Prior Publication Data

US 2021/0241993 A1 Aug. 5, 2021

(30) Foreign Application Priority Data

Nov. 27, 2019 (JP) .............................. JP2019-213805

(51) Int. Cl.
*H01J 37/18* (2006.01)
(52) U.S. Cl.
CPC ....... *H01J 37/185* (2013.01); *H01J 2237/184* (2013.01)
(58) Field of Classification Search
CPC .......................... H01J 37/185; H01J 2237/184
USPC ............. 250/306, 307, 309, 310, 311, 492.1, 250/492.2, 492.21, 492.22, 492.23, 492.3
See application file for complete search history.

(56) References Cited

U.S. PATENT DOCUMENTS

| 2014/0168629 A1* | 6/2014 | Nishida | H01J 37/304 355/77 |
| 2015/0060694 A1* | 3/2015 | Gunji | H01J 37/28 250/440.11 |
| 2019/0033256 A1* | 1/2019 | Matsushita | H01J 49/04 |

FOREIGN PATENT DOCUMENTS

| JP | 2009-76495 A | 4/2009 |
| JP | 2015-70097 A | 4/2015 |
| JP | 2016-192457 A | 11/2016 |

* cited by examiner

*Primary Examiner* — Nicole M Ippolito
(74) *Attorney, Agent, or Firm* — Crowell & Moring LLP

(57) ABSTRACT

Provided is a charged particle beam device capable of making a time lag as small as possible when transporting a succeeding wafer from an FOUP to an SC in parallel with returning a preceding wafer from a sample chamber to the FOUP. The charged particle beam device according to the disclosure predicts a completion time point at which a recipe of the preceding wafer is ended, and sets a time point at which the succeeding wafer is started to be taken out from the FOUP so that a timing at which the succeeding wafer is taken out from the FOUP to a load lock chamber and vacuum evacuation of the load lock chamber is completed matches the completion time point.

12 Claims, 8 Drawing Sheets

CHARGED PARTICLE BEAM DEVICE

TECHNICAL FIELD

The present disclosure relates to a charged particle beam device.

BACKGROUND ART

A charged particle beam device operates in accordance with a processing method called a recipe and data that specifies parameters. For example, a scanning electron microscope (SEM) measures fine patterns on a wafer in accordance with the recipe. A manufacturing site is often unmanned, and the charged particle beam device automatically executes the recipe. In the charged particle beam device, increasing the number of wafers processed per hour (hereinafter, throughput) and improving an operation rate of the device are urgent issues.

At a semiconductor device manufacturing site, a container called a front opening unified pod (FOUP) where a plurality of wafers are accommodated is transported to the charged particle beam device. In order to transport the wafers to a sample chamber (hereinafter, SC) where the recipe is executed, the charged particle beam device takes out one wafer from the FOUP and once transports the wafer to a load lock chamber (hereinafter, LC). The LC is a room for connecting the FOUP under an atmospheric pressure and the SC under a high vacuum. The LC switches to the atmosphere when connected to the FOUP, and switches to the vacuum when connected to the SC. After the wafer is transported to the LC, a door connected to the FOUP is closed, and an inside of the LC is evacuated. After the LC becomes vacuum, a door connected to the SC is opened, and the wafer is transported to the SC. After the wafer is transported to the SC, a door connected to the LC is closed, and the recipe is started. When the recipe is ended, the door connected to the LC is opened and the wafer is transported to the LC. After the wafer is transported to the LC, the door connected to the SC is closed, and the LC is switched to the atmosphere. After the LC is switched to the atmosphere, the door connected to the FOUP is opened and the wafer is returned to the FOUP.

At the semiconductor device manufacturing site, the charged particle beam device continuously executes the recipe. In order to reduce time for exchanging a preceding wafer and a succeeding wafer when executing the recipe continuously, the succeeding wafer is transported to the LC and the inside of the LC is evacuated after the recipe of the preceding wafer is started. The succeeding wafer is kept waiting in the LC until the recipe of the preceding wafer is ended. After the recipe of the preceding wafer is ended, the door connecting the LC and the SC is opened, and the succeeding wafer and the preceding wafer are exchanged. After the preceding wafer and the succeeding wafer are exchanged, the preceding wafer is returned to the FOUP, the succeeding wafer is transported to the SC, and the recipe is executed.

PTL 1 to be described below is to "provide a vacuum processing device capable of accurately predicting an end time point of processing a wafer in a carrier cassette and quickly exchanging the carrier cassette", and discloses a technique in which "in a vacuum processing device, wafers accommodated in carrier cassettes 11 to 13 are transported to a load lock chamber 301 via an atmospheric transport device 23 and are transported from the load lock chamber to processing chambers 101 to 104 by a vacuum transport device 202, the transported wafers processed in the processing chambers are transported to an unload lock chamber 302 by the vacuum transport device, and are further returned to the original carrier cassettes by the atmospheric transport device, a control controller 301 predicts time points when processings of all wafers accommodated in the carrier cassettes are ended based on a processing condition for each type of the wafers and processing states in the plurality of processing chambers" (see abstract).

PTL 2 to be described below is to "reduce time when a substrate is held in a vacuum state", and discloses a technique in which "A substrate processing device includes processing chambers 10 and 11 where substrate processing is performed in a plurality of steps under a reduced first pressure, that is, under vacuum, load lock chambers 5 and 6 which are adjacent to the processing chambers 10 and 11 and where a substrate is transported from an outside under a second pressure higher than the first pressure, that is, under an atmospheric pressure, and the substrate is transported into the processing chambers 10 and 11 under the first pressure, an exhaust unit that exhausts and depressurizes the load lock chambers 5 and 6, and a control unit 60 that performs the substrate processing in the processing chambers 10 and 11 and control of the exhaust unit. The control unit 60 starts the substrate processing in the processing chambers 10 and 11, and starts exhausting the load lock chambers 5 and 6 after a predetermined time has elapsed since a substrate to be processed next is transported into the load lock chambers 5 and 6 from the outside." (see abstract).

PTL 3 to be described below is to "provide a semiconductor inspection device capable of accurately calculating an inspection end time point and reducing waiting time when a hoop is transported in and collected in the semiconductor inspection device", and discloses a technique in which "when a conductor inspection device 104 completes calculation of an inspection end time point of a hoop 103, the conductor inspection device 104 notifies an upper HOST 107 of the inspection end time point of the FOUP. This notice is given to hoops 103 held in all load ports 105, and finally, processing time of the hoops 103 held in all load ports 105 is added up to notify a processing end time point of the entire semiconductor inspection device." (see abstract).

CITATION LIST

Patent Literature

PTL 1: JP-A-2009-076495
PTL 2: JP-A-2015-070097
PTL 3: JP-A-2016-192457

SUMMARY OF INVENTION

Technical Problem

The LC is equipped with a vacuum device for switching to vacuum. Since radiant heat of the vacuum device of the LC is large, temperature of a wafer gradually rises when the inside of the LC is evacuated and the wafer is kept waiting therein. When the temperature of the wafer rises, a temperature difference occurs between a table on which the wafer is placed and the wafer and the wafer undergoes thermal contraction after the wafer is transported to the SC. When the wafer undergoes the thermal contraction, an image drifts when a fine pattern is captured. The charged particle beam device sets a waiting time until the drift becomes stable in order to avoid the image drift caused by the temperature difference between the table on which the wafer is placed and the wafer. The larger the temperature difference is, the longer the stabilization waiting time is, and therefore the throughput lowers.

In PTL 1 described above, when the wafers processed under different conditions are mixed in the carrier cassettes, processing end time points of all the wafers accommodated in the carrier cassettes are predicted. However, this document is not always clear about a method of aligning timings of the preceding wafer and the succeeding wafer when the succeeding wafer is transported to the SC in parallel with returning the preceding wafer to the FOUP.

PTL 2 described above is to shorten the time when the substrate is kept waiting in the vacuum state in the load lock chamber as much as possible. In this document, in order to implement this, the exhaustion of the load lock chamber is started after the substrate processing is completed. In this case, since the exhaustion is not started immediately after the substrate is introduced into the load lock chamber, the time for waiting in the vacuum state can be shortened. However, since there is a time lag from the completion of the substrate processing to completion of exhaustion of the load lock chamber, there is waiting time from completion of processing a previous substrate to start of processing a next substrate.

In PTL 3 described above, the transport is controlled so that the FOUP is collected at a scheduled end time point. However, in this document, since an FOUP collection request is transferred when the inspection is completed and a transport-in request is transferred when the collection is completed, it is considered that a next FOUP is not being transported into the sample chamber in parallel with collecting a previous FOUP from the sample chamber.

The disclosure has been made in view of the above-described technical problems, and an object thereof is to provide a charged particle beam device capable of making a time lag as small as possible when transporting a succeeding wafer from an FOUP to an SC in parallel with returning a preceding wafer from a sample chamber to the FOUP.

Solution to Problem

A charged particle beam device according to the disclosure predicts a completion time point at which a recipe of a preceding wafer is ended, and sets a time point at which a succeeding wafer is started to be taken out from an FOUP so that a timing at which the succeeding wafer is taken out from the FOUP to a load lock chamber and vacuum evacuation of the load lock chamber is completed matches the completion time point.

Advantageous Effect

According to the charged particle beam device of the disclosure, temperature rise of a wafer due to radiant heat can be reduced by minimizing time when a succeeding wafer waits in an LC. Accordingly, a temperature difference between a wafer after being transported to an SC and a table on which the wafer is placed is reduced and waiting time until a drift becomes stable is reduced, and thus a throughput is improved.

DESCRIPTION OF EMBODIMENTS

First Embodiment

Figure 1:
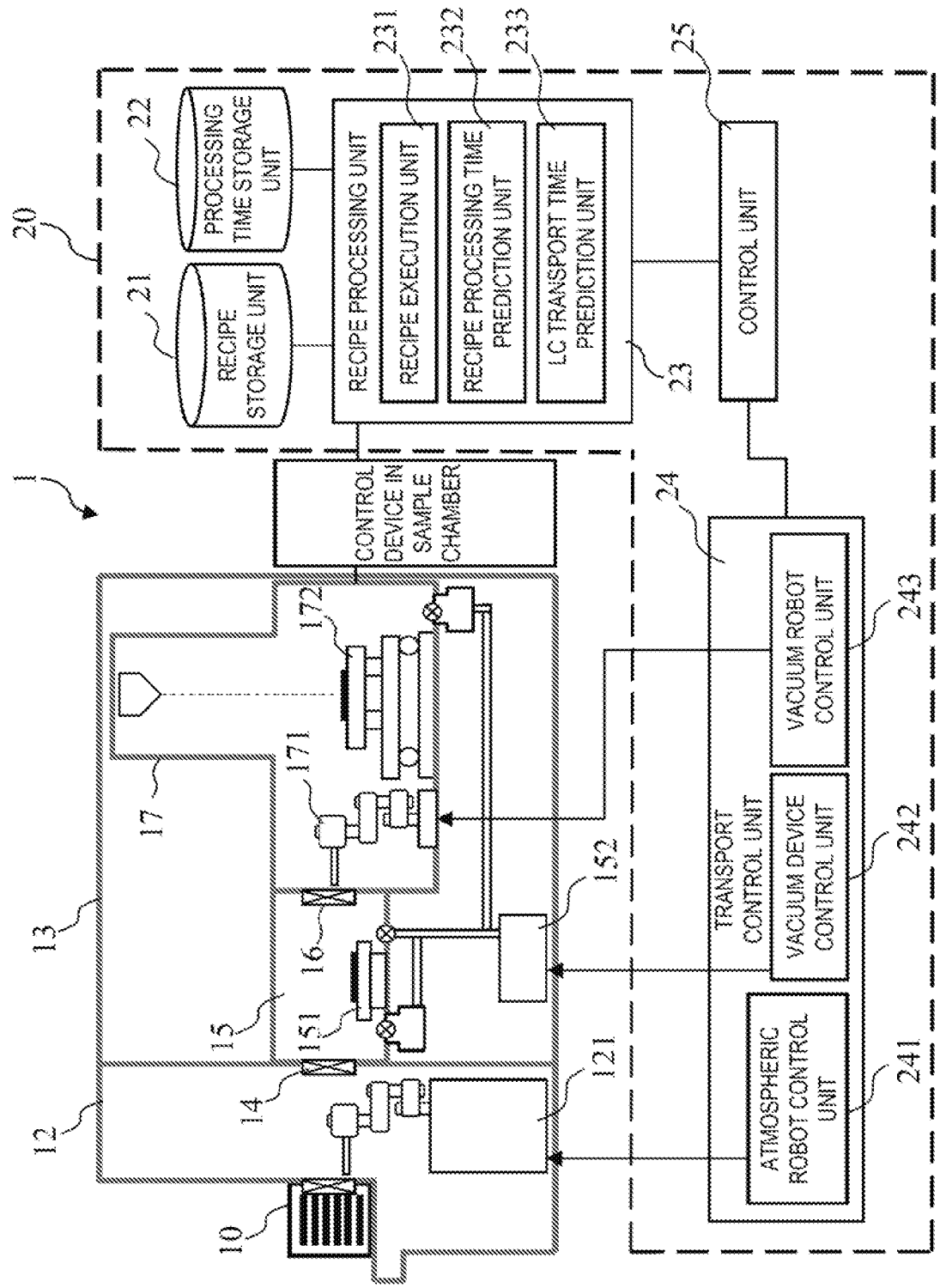
FIG. 1 is a configuration diagram of a charged particle beam device 1 according to a first embodiment.

FIG. 1 is a configuration diagram of the charged particle beam device 1 according to a first embodiment of the disclosure. The charged particle beam device 1 is a device that irradiates a sample (a semiconductor wafer in the first embodiment) with a charged particle beam in accordance with a description of a recipe. The charged particle beam device 1 includes a mini environment (hereinafter referred to as minien) 12, a main body 13, and the computer system 20.

The wafer is placed in a container (hereinafter referred to as an FOUP 10) where a plurality of wafers are accommodated and is transported to the charged particle beam device 1. The FOUP 10 is accommodated in the minien 12 once. An atmospheric robot 121 inside the minien 12 takes out the wafer in the FOUP 10. The minien 12 and the main body 13 are connected to each other. When the wafer is transported from the minien 12 to the main body 13, an atmospheric door 14 is opened and the wafer is transported to a sample table 151 in an LC 15. The LC 15 is evacuated by a vacuum device 152. After the vacuum evacuation of the LC 15 is completed, a vacuum door 16 is opened, and the wafer on the sample table 151 is transported to a stage 172 in an SC 17 by a vacuum robot 171.

The computer system 20 includes a recipe storage unit 21, a processing time storage unit 22, a recipe processing unit 23, a transport control unit 24, and a control unit 25. The recipe processing unit 23 further includes a recipe execution unit 231, the recipe processing time prediction unit 232, and an LC transport time prediction unit 233. The transport control unit 24 further includes an atmospheric robot control unit 241, a vacuum device control unit 242, and a vacuum robot control unit 243.

The atmospheric robot control unit 241 controls the atmospheric robot 121. The vacuum device control unit 242 controls the vacuum device 152. The vacuum robot control unit 243 controls the vacuum robot 171. The recipe execution unit 231, the recipe processing time prediction unit 232, and the LC transport time prediction unit 233 will be described later. The control unit 25 controls each unit provided in the charged particle beam device 1.

The recipe is stored in the recipe storage unit 21. When starting the recipe, the recipe execution unit 231 reads the recipe from the recipe storage unit 21 and controls each unit of the main body 13 in accordance with the recipe. When the recipe of a preceding wafer is started, the control unit 25 causes the transport control unit 24 to start transport of a succeeding wafer.

Figure 2:
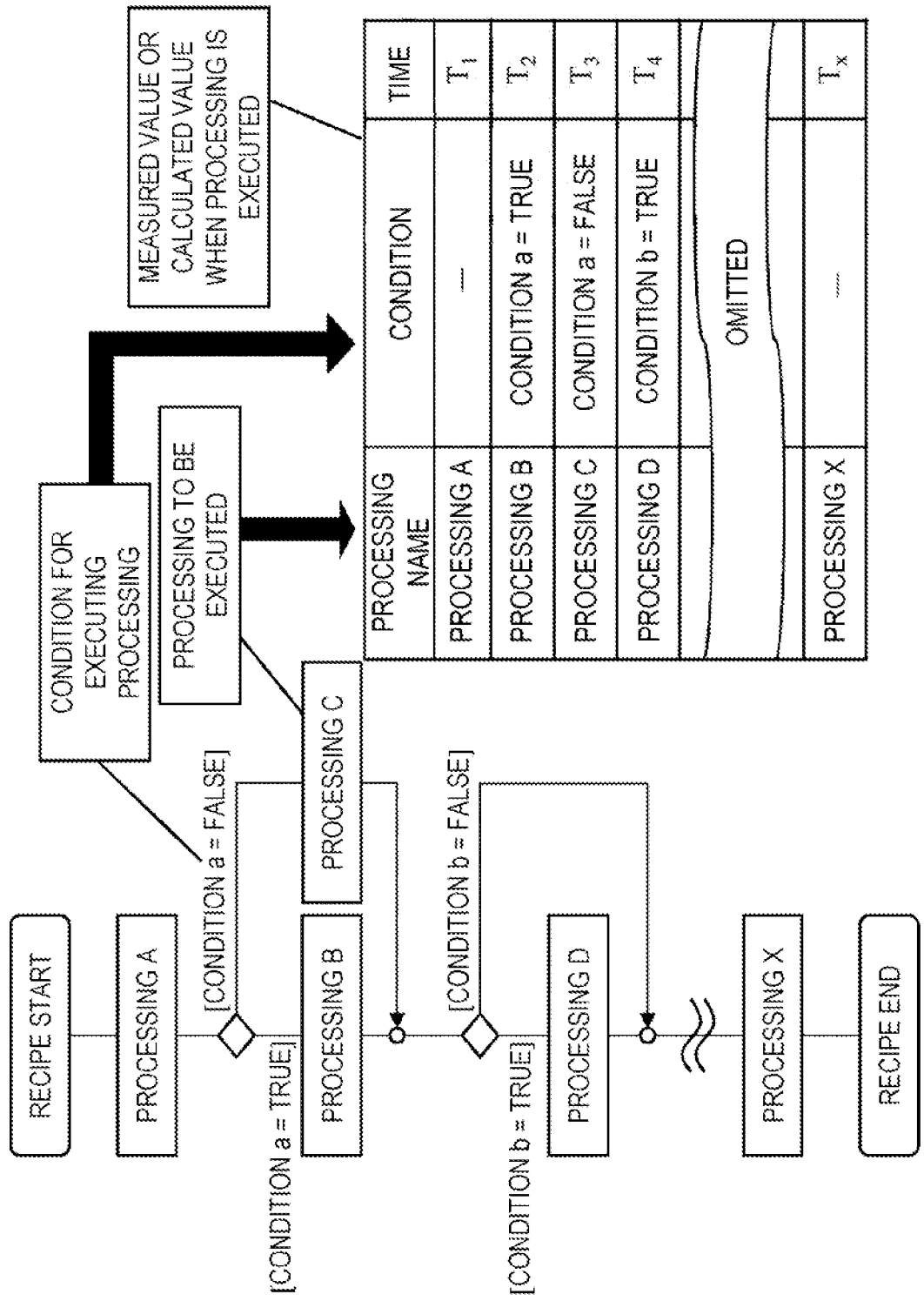
FIG. 2 is an example of a method of extracting all processings described in a recipe.

FIG. 2 is an example of a method of extracting all processings described in the recipe. The recipe processing time prediction unit 232 extracts all the processings executed in the recipe when predicting an end time point of the recipe. Whether to execute a processing to be executed in the recipe is determined by recipe setting. The recipe processing time prediction unit 232 manages all the extracted processings and setting of a recipe to be executed. Accordingly, when the recipe is actually executed, processings to be executed in a current recipe setting can be specified. The recipe processing time prediction unit 232 describes a required processing time required to execute each of the processings in a file (hereinafter, referred to as a recipe processing time file). The execution time may be a measured value obtained by an actual operation or a calculated value obtained by calculation based on an algorithm. Accordingly, when the recipe is actually executed, a required processing time of the processings to be executed in the current recipe setting can be calculated. The recipe processing time prediction unit 232 stores the recipe processing time file in the processing time storage unit 22.

Figure 3:
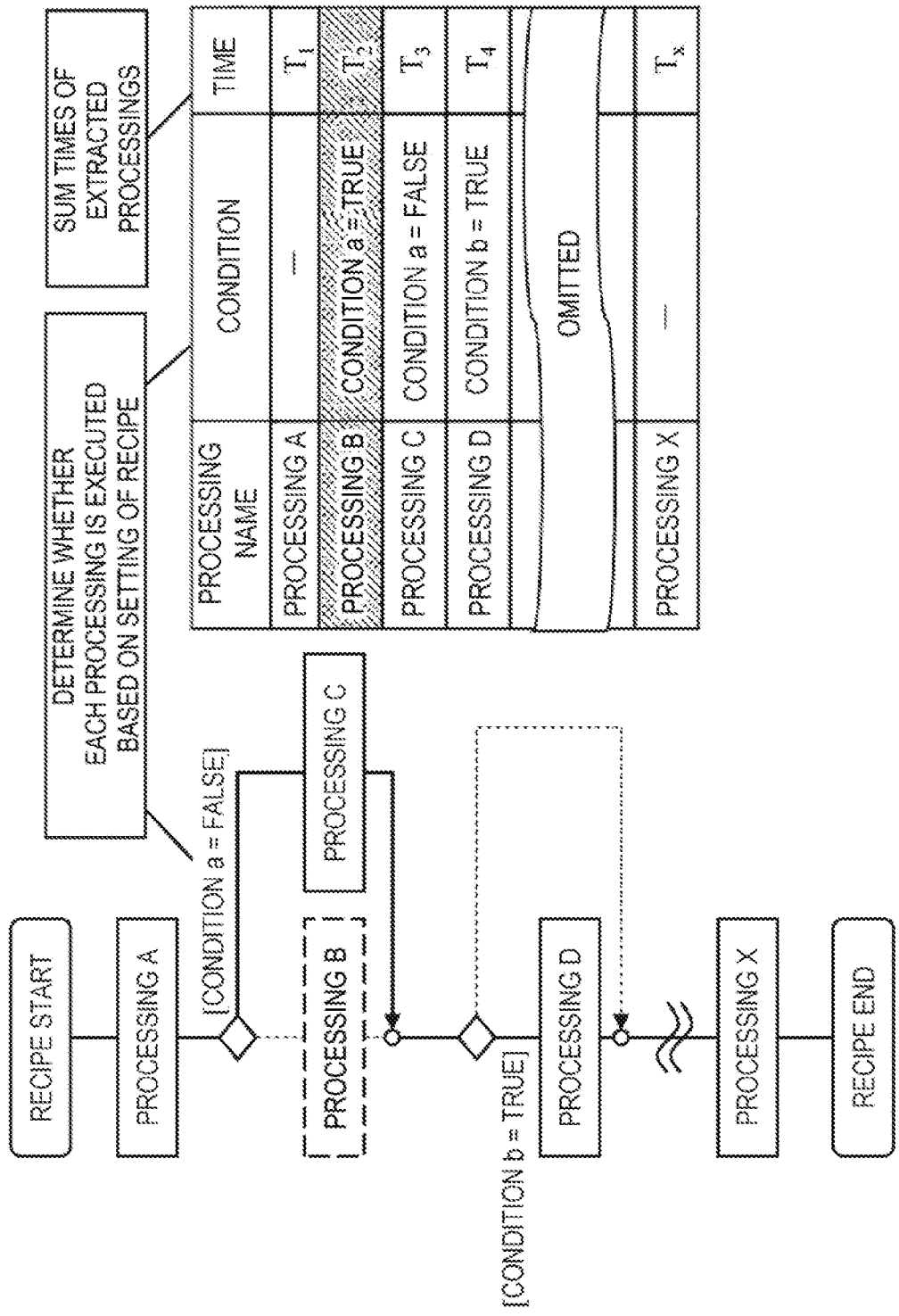
FIG. 3 is an example of a method of extracting, by a recipe processing time prediction unit 232, processings to be executed in a current recipe setting.

FIG. 3 is an example of a method of extracting, by the recipe processing time prediction unit 232, the processings to be executed in the current recipe setting. After the recipe execution unit 231 starts the recipe of the preceding wafer, the recipe processing time prediction unit 232 acquires the recipe processing time file. The recipe processing time prediction unit 232 extracts the processings to be executed in the current recipe setting by determining whether each of the processings in the recipe is executed in accordance with the setting of the currently executed recipe. The recipe processing time prediction unit 232 searches the recipe processing time file for the extracted processings and acquires the required processing times. The recipe processing time prediction unit 232 adds up the required processing times for all the extracted processings. A total time thereof is defined as time from the start to the end of the recipe (hereinafter, referred to as a total recipe time). The recipe processing time prediction unit 232 calculates a time point at which the recipe is ended (predicted completion time point) by adding the calculated total recipe time to a recipe start time point.

Hereinafter, a method of calculating time (hereinafter, referred to as wafer transport time) required to complete the vacuum evacuation of the LC 15 after the wafer is taken out of the FOUP 10 and is transported to the LC 15 will be described. The time from when the wafer is started to be taken out from the FOUP 10 to when the vacuum evacuation of the LC 15 is completed is a sum of (a) time (hereinafter, referred to as LC transport time) from when the wafer is started to be taken out from the FOUP 10 to when placement of the wafer on the sample table 151 in the LC 15 is completed and the atmospheric door 14 is closed, and (b) time (hereinafter, referred to as LC vacuum evacuation time) from when the vacuum evacuation of the LC 15 is started to when the vacuum evacuation is completed. The LC transport time prediction unit 233 sets the LC transport time and the LC vacuum evacuation time to fixed values and stores them in advance. The LC transport time prediction unit 233 calculates the wafer transport time by summing the LC transport time and the LC vacuum evacuation time which are stored in advance.

Figure 4:
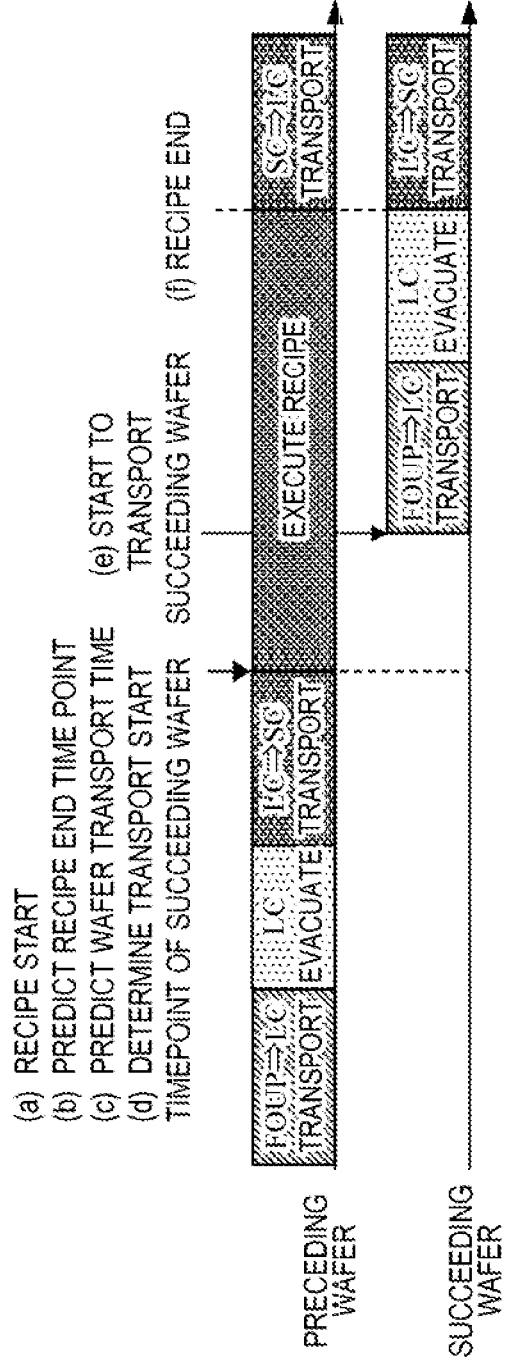
FIG. 4 is a timing chart showing a procedure of determining, by a computer system 20, a transport start time point of a succeeding wafer.

FIG. 4 is a timing chart showing a procedure of determining, by the computer system 20, a transport start time point of the succeeding wafer. Hereinafter, a method of determining the transport start time point of the succeeding wafer so that a time point at which recipe processing of the preceding wafer is ended matches a time point at which the LC vacuum evacuation is completed will be described with reference to FIG. 4.

(a) The recipe execution unit 231 starts the recipe processing for the preceding wafer. (b) Immediately after the start of the recipe, the recipe processing time prediction unit 232 predicts the time point at which the recipe is ended in accordance with the procedures described in FIGS. 2 and 3. (c) The LC transport time prediction unit 233 calculates the wafer transport time. (d) The recipe processing unit 23 determines a time point at which the succeeding wafer is started to be taken out from the FOUP 10 in accordance with the recipe end time point and the wafer transport time. The time point at which the succeeding wafer is started to be taken out from the FOUP 10 is a time point obtained by subtracting the wafer transport time calculated in (c) from the time point which is calculated in (b) at which the recipe is ended. The transport control unit 24 sets this time point as a take-out start time point. (e) The transport control unit 24 starts to take out the succeeding wafer from the FOUP 10 at the take-out start time point. Accordingly, since the vacuum evacuation of the LC 15 is completed at a time point (f) at which the recipe is ended, time when the succeeding wafer waits in the LC 15 can be minimized.

Second Embodiment

In the first embodiment, a recipe completion time point is predicted by summing required processing times on an assumption that no error occurs during recipe execution. However, when an error occurs during the recipe execution, for example, a protection processing may start immediately after the error occurs, and a time point at which a recipe is ended may be delayed. Such an error cannot be grasped in advance. Accordingly, time when a succeeding wafer waits in the LC 15 and time when a preceding wafer waits in the SC 17 after the recipe is ended may increase. Therefore, a second embodiment of the disclosure describes a method of dynamically determining a timing at which the succeeding wafer is started to be taken out from the FOUP 10. A configuration of the charged particle beam device 1 is the same as that of the first embodiment.

Figure 5:
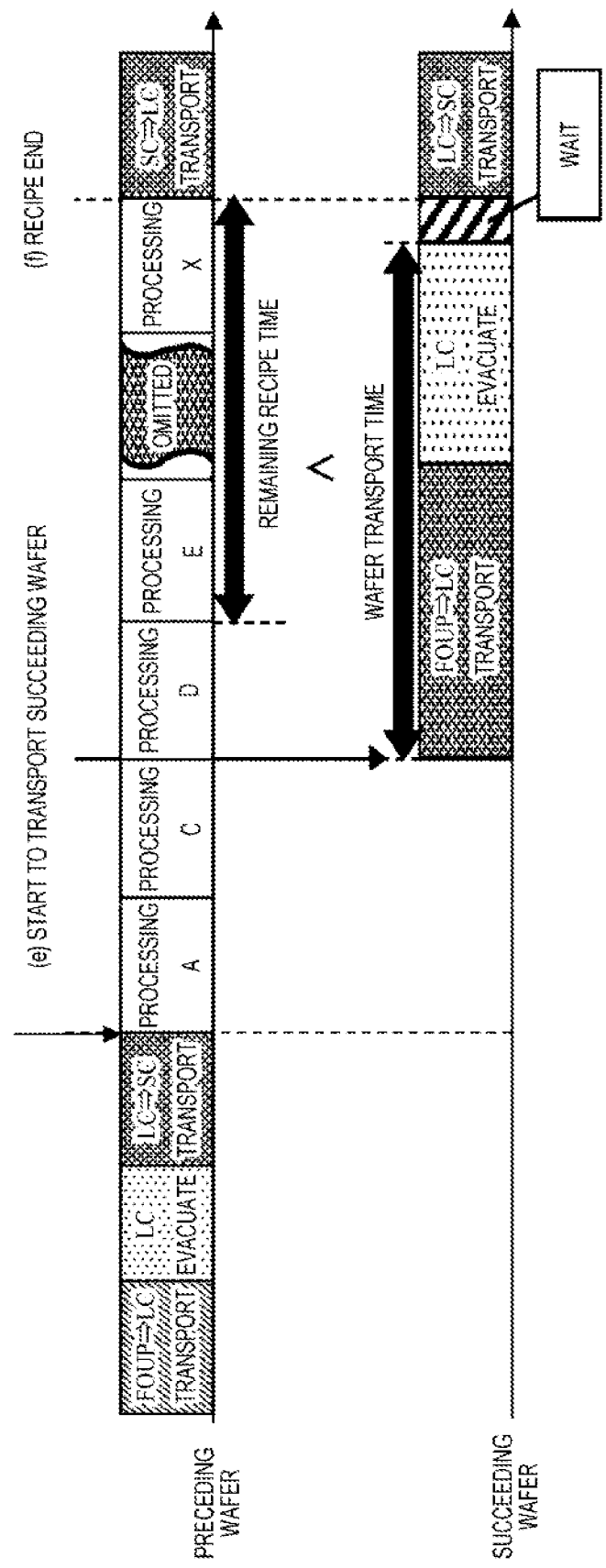
FIG. 5 is a timing chart showing a procedure of determining, by the computer system 20, a transport start time point of a succeeding wafer according to a second embodiment.

FIG. 5 is a timing chart showing a procedure of determining, by the computer system 20, a transport start time point of the succeeding wafer in the present second embodiment. Hereinafter, each step in FIG. 5 will be described.

(a) is the same as that in FIG. 4. (b) The recipe processing time prediction unit 232 extracts processings to be executed among processings described in the recipe in accordance with a current recipe setting, and acquires the required processing times. (c) is the same as that in FIG. 4.

(d-1) The recipe processing time prediction unit 232 calculates a remaining recipe time. Specifically, it is assumed that the processings which are extracted in (b) and are executed in the recipe are sequentially started from a beginning, and a sum of execution times to be used for the processings is the remaining recipe time. In an example shown in FIG. 5, a sum of execution times to be used from a processing A to a processing X is the remaining recipe time.

(d-2) The recipe processing time prediction unit 232 determines the timing at which the transport of the succeeding wafer is started with the following procedure. It is assumed that the recipe is started to be executed from a first processing extracted in (b), and the remaining recipe time is compared with the wafer transport time calculated in (c). When the remaining recipe time is longer than the wafer transport time, it is assumed that the recipe is started to be executed from a next processing in the recipe, and similarly, the remaining recipe time is compared with the wafer transport time calculated in (c). Similar comparisons are executed while shifting a processing from which the recipe is assumed to be started to be executed one by one, and the comparison is ended at a time point at which the remaining recipe time is shorter than the wafer transport time or they are the same. At this time point, when the remaining recipe time is the same as the wafer transport time, it is decided to start to take out the succeeding wafer from the FOUP 10 when the processing from which the recipe is assumed to be started to be executed is started. When the remaining recipe time is shorter than the wafer transport time, it is decided that the succeeding wafer is started to be taken out from the FOUP 10 when a processing one prior to the processing from which the recipe is assumed to be started to be executed is started.

(d-2: Specific Example 1) In FIG. 5, when it is assumed that the recipe is started to be executed from the processing A, the remaining recipe time (time from the processing A to the processing X) is compared with a succeeding wafer transport time. Since the remaining recipe time is longer, the processing from which the recipe is assumed to be started to be executed is advanced by one.

(d-2: Specific Example 2) In FIG. 5, when it is assumed that the recipe is started to be executed from the processing E, the remaining recipe time is shorter than the wafer transport time. Therefore, the succeeding wafer is started to be taken out from the FOUP 10 when the processing D one prior to the current processing (processing E) from which the recipe is started to be executed is started. When the remaining recipe time is the same as the wafer transport time, the succeeding wafer is started to be taken out from the FOUP 10 when the current processing (processing E) from which the recipe is started to be executed is started.

(d-2: Supplement) When the processing (processing D in the above-described example) one prior to the processing E is specified, the time when the succeeding wafer waits in the LC 15 may occur after vacuum evacuation of the LC 15 is completed. On the other hand, when the current processing (processing E in the above-described example) from which the recipe is started to be executed is set as the wafer transport start timing instead of the processing one prior to the processing E, the vacuum evacuation of the LC of the succeeding wafer may not be completed when the recipe of the preceding wafer is ended. Accordingly, the time when the preceding wafer waits in the SC 17 occurs, and a throughput remarkably lowers. Therefore, in the present embodiment, the processing one prior to the processing E is set as the succeeding wafer transport start timing.

After the recipe processing time prediction unit 232 executes (d-2), the recipe of the preceding wafer is started to be executed. (e) The transport control unit 24 starts the transport of the succeeding wafer at the timing determined in (d-2). Accordingly, even when an error occurs in any one of the processings A, C, and D, since the succeeding wafer transport start timing is determined by comparing the remaining recipe time after the processing E with the wafer transport time, it is possible to prevent the time when the succeeding wafer waits in the LC 15 and the time when the preceding wafer waits in the SC 17 after the recipe is ended from becoming long.

Second Embodiment: Summary

The charged particle beam device 1 according to the second embodiment predicts a scheduled completion time ((f) in FIG. 5) by summing the required processing time of each of the processings to be executed when the recipe is executed, calculates the remaining recipe time by summing the required processing time of each of the processings back from the scheduled completion time, and specifies a time point at which the remaining recipe time is equal to or greater than a sum of an LC transport time and an LC vacuum evacuation time. The charged particle beam device 1 starts to take out the succeeding wafer from the FOUP 10 when a processing from which a recipe is scheduled to be started to be executed or scheduled to be during execution at this time point is started. Accordingly, even when an error occurs during the recipe execution and a processing completion time point is changed, the succeeding wafer is still started to be taken out from the FOUP 10 when the processing (processing D in the example of FIG. 5) specified in advance is started. Therefore, even in such a case, the preceding wafer and the succeeding wafer can be taken in and taken out of the SC 17 in parallel.

Third Embodiment

When an error occurs during recipe execution, a protection processing may be executed at an end of a recipe instead of being executed immediately. Further, the recipe may be interrupted in the middle of the recipe, and a processing other than a currently set processing may be added or the currently set processing may be deleted. In this case, an end time point of the recipe and remaining time of the recipe change. Therefore, a third embodiment of the disclosure describes a method of recalculating the remaining recipe time and determining a succeeding wafer transport start timing again in accordance with a result thereof when a processing is changed in the middle of the recipe. A configuration of the charged particle beam device 1 is the same as that of the first embodiment.

Figure 6:
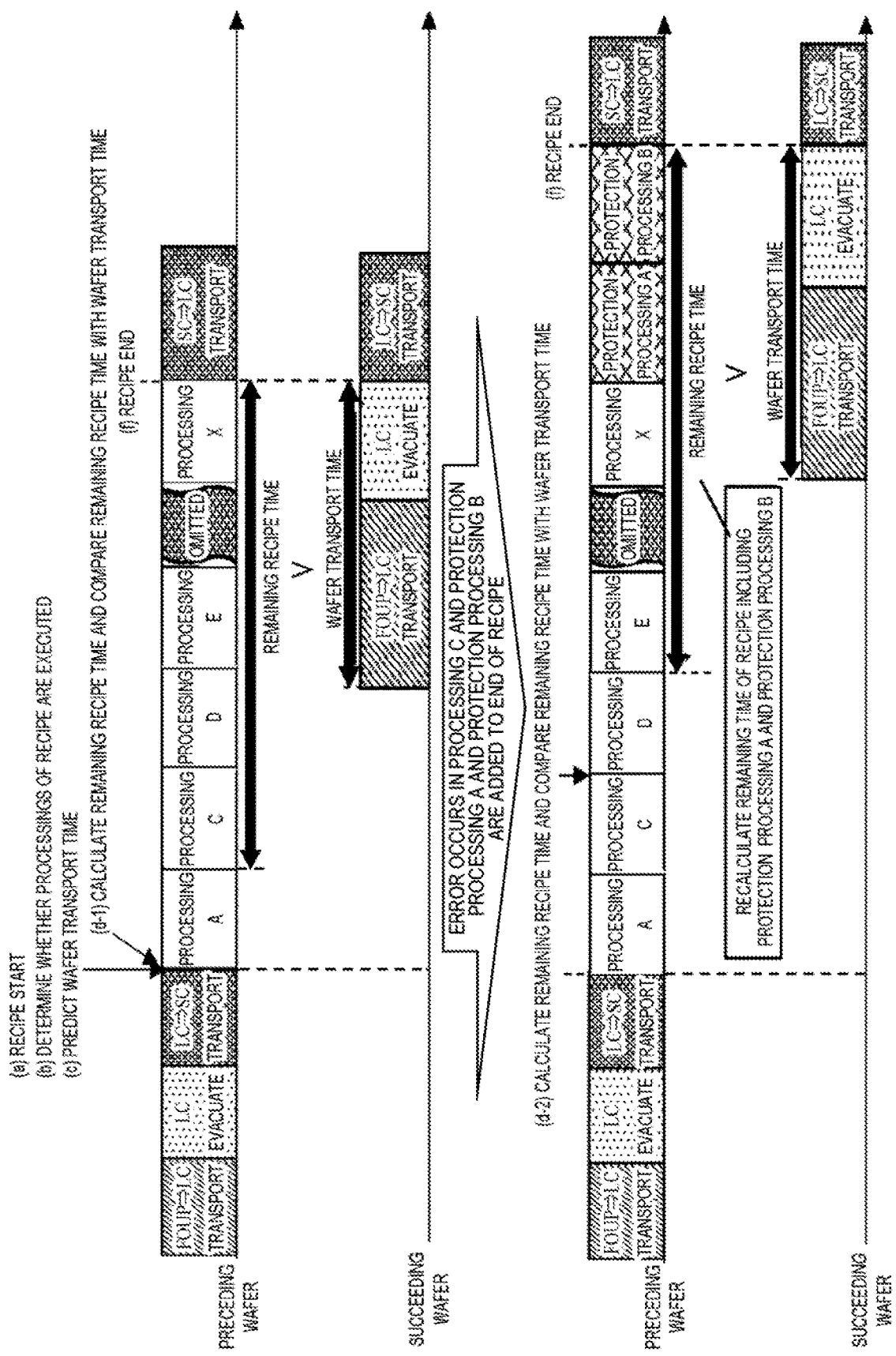
FIG. 6 is a timing chart showing a procedure of determining, by the computer system 20, a transport start time point of a succeeding wafer according to a third embodiment.

FIG. 6 is a timing chart showing a procedure of determining, by the computer system 20, the transport start time point of the succeeding wafer in the third embodiment. Hereinafter, each step in FIG. 6 will be described.

(a) is the same as that in FIG. 4. (b) The recipe processing time prediction unit 232 extracts processings to be executed among processings described in the recipe in accordance with a current recipe setting, and acquires required processing times. (c) is the same as that in FIG. 4.

(d-1) In an upper part of FIG. 6, the recipe processing time prediction unit 232 calculates the remaining recipe time before the recipe is started to be executed. The remaining recipe time is calculated in advance for each processing. That is, the remaining recipe time is calculated for each processing, such as a remaining recipe time at a time point at which the processing A is started and a remaining recipe time at a time point at which the processing C is started. Since the remaining recipe time is longer than a wafer transport time at the time point at which the processing A is started, the succeeding wafer is not started to be transported.

(d-2) When a processing is changed (added to, deleted from, and the like) during the recipe execution, the recipe processing time prediction unit 232 updates the processings extracted in (b) with changed contents, and then recalculates a remaining recipe time for each processing. In FIG. 6, an error occurs when the processing C is executed, and a protection processing A and a protection processing B are added to the end of the recipe. The recipe processing time prediction unit 232 adds a required processing time of each of the protection processing A and the protection processing B when calculating the remaining recipe time. The recipe processing time prediction unit 232 recalculates a remaining recipe time (required processing time from the processing E to the protection processing B) before the processing D is started to be executed.

When a content or an order of a processing to be executed during the recipe is changed, the recipe processing time prediction unit 232 recalculates the remaining recipe time in a period from a change time point to a start of a next processing (from the error occurrence to the start of the processing D in FIG. 6). Accordingly, the succeeding wafer transport start timing can be correctly reset after the time point at which the next processing is started.

Some recipes include a processing to be manually executed by a user of the charged particle beam device 1. In this case, a completion time point of the processing changes depending on an operation of the user. Therefore, the recipe processing time prediction unit 232 may recalculate the remaining recipe time each time the manual execution processing is completed.

According to the third embodiment, since the remaining recipe time is recalculated each time the processing content or the processing order is changed, the succeeding wafer transport start timing can be accurately determined even when the processing is changed during the recipe execution.

Fourth Embodiment

In a case where times described in a recipe processing time file are fixed values, when a processing is actually executed, a time may vary depending on a machine difference and a recipe setting, and a time point at which a recipe is ended and a remaining recipe time may change. Therefore, a fourth embodiment of the disclosure describes a method of updating a required processing time based on a measured value when the time required to execute processings described in the recipe processing time file varies depending on a charged particle beam device or a recipe. A configuration of the charged particle beam device 1 is the same as that of the first embodiment.

The recipe processing time file is prepared in advance for each charged particle beam device 1 and each recipe. The recipe execution unit 231 acquires an actual required processing time by actually executing the recipe and records the required processing time in the recipe processing time file for each charged particle beam device 1 and each recipe.

Specifically, the required processing time is acquired by calculating a difference between a processing start time point and an end time point. An item for storing the measured time for each processing is prepared in the recipe processing time file, and the acquired time is recorded in the item. The required processing time is not acquired when an error occurs during the processing, the processing is interrupted, or an interruption occurs. Further, a measured value is not acquired for a processing which cannot be executed automatically or for a processing in which the required processing time is calculated by calculation. As the time of each of the processings used to calculate a total recipe time, for example, an average value of measured times measured a plurality of times may be adopted.

With the above procedure, the recipe processing time file is managed for each charged particle beam device and each recipe. When predicting a recipe end time point or when calculating the recipe remaining time, the recipe processing time prediction unit 232 uses a recipe processing time corresponding to the charged particle beam device and the recipe which are currently being executed and calculates these times. The fourth embodiment can be used in combination with other embodiments.

The present fourth embodiment has described a method of updating the time required to execute the processings described in the recipe processing time file for each charged particle beam device and each recipe, but this method is just an example and the invention is not limited thereto. For example, the fourth embodiment has described that the average value of measured values measured a plurality of times is used. Instead of this, for example, the acquired measured values may be divided into some sections ((example) 0 to 10, 10 to 20) and stored, and a mode value may be used as the time of each processing. The measured value can also be acquired by other appropriate methods.

Fifth Embodiment

Time required for evacuating a wafer changes depending on a process step and a material of the wafer. For example, when evacuation of an outgas wafer is performed, since gas is released from an organic material or the like on a surface of the wafer, an vacuum evacuation time is longer than that of a wafer made of a silicon material. A charged particle beam device performs vacuum evacuation until a vacuum value reaches a certain value or more. At a semiconductor device manufacturing site, since a recipe is assigned for each wafer material and each process step, an LC vacuum evacuation time is managed for each recipe. Therefore, a fifth embodiment of the disclosure describes a method of setting an LC vacuum evacuation time of a succeeding wafer for each recipe. A configuration of the charged particle beam device 1 is the same as that of the first embodiment.

Figure 7:
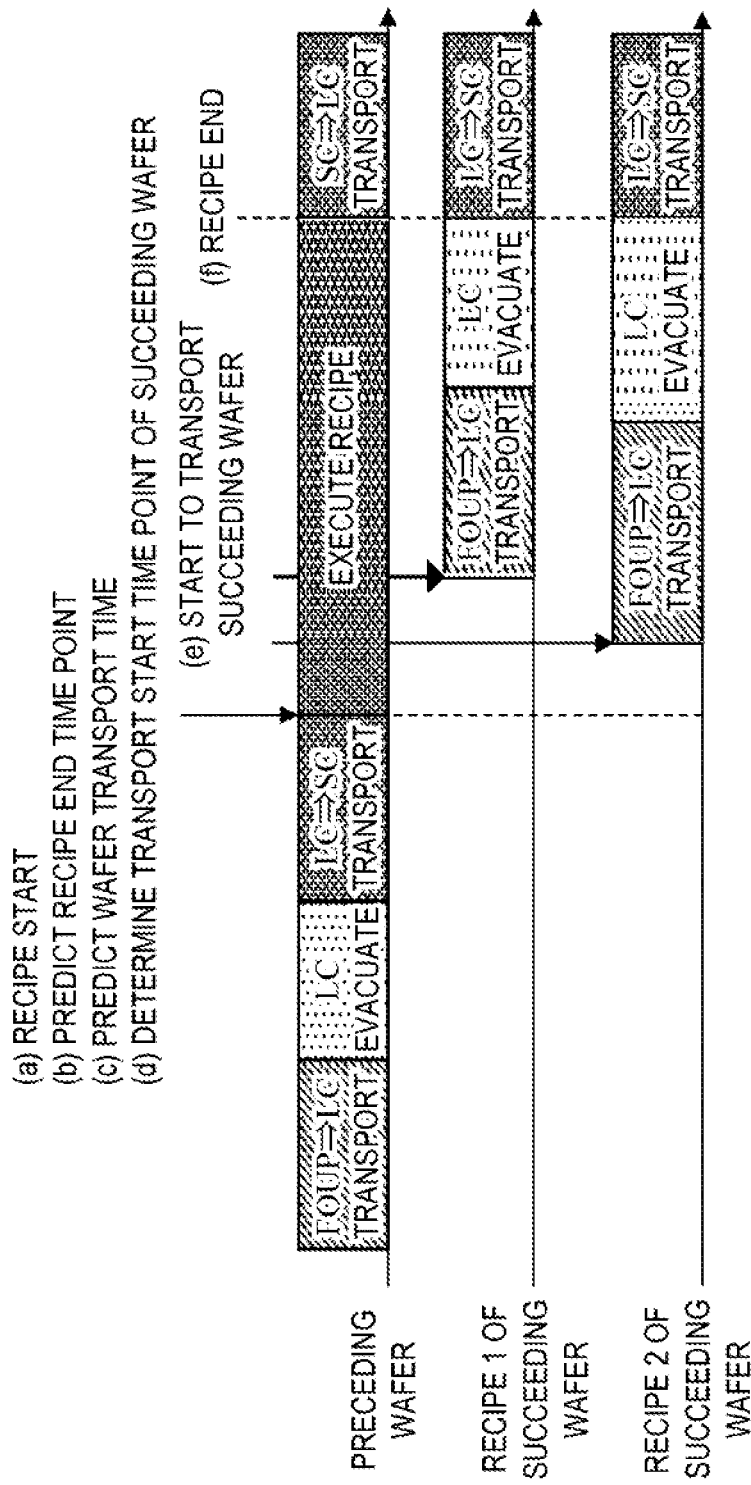
FIG. 7 is a timing chart showing a procedure of determining, by the computer system 20, a transport start time point of a succeeding wafer according to a fifth embodiment.

FIG. 7 is a timing chart showing a procedure of determining, by the computer system 20, the transport start time point of the succeeding wafer in the fifth embodiment. The steps (a) to (f) are the same as those in the first embodiment, except that the LC vacuum evacuation time is individually set for each recipe to be performed on the succeeding wafer. In an example of FIG. 7, an LC vacuum evacuation time in a recipe 1 is shorter than a vacuum evacuation time in a recipe 2. As a result, a succeeding wafer transport start timing is different for the recipe 1 and the recipe 2. Accordingly, a more accurate LC vacuum evacuation time can be set for a process step or a wafer material having a different LC vacuum evacuation time.

Sixth Embodiment

Figure 8:
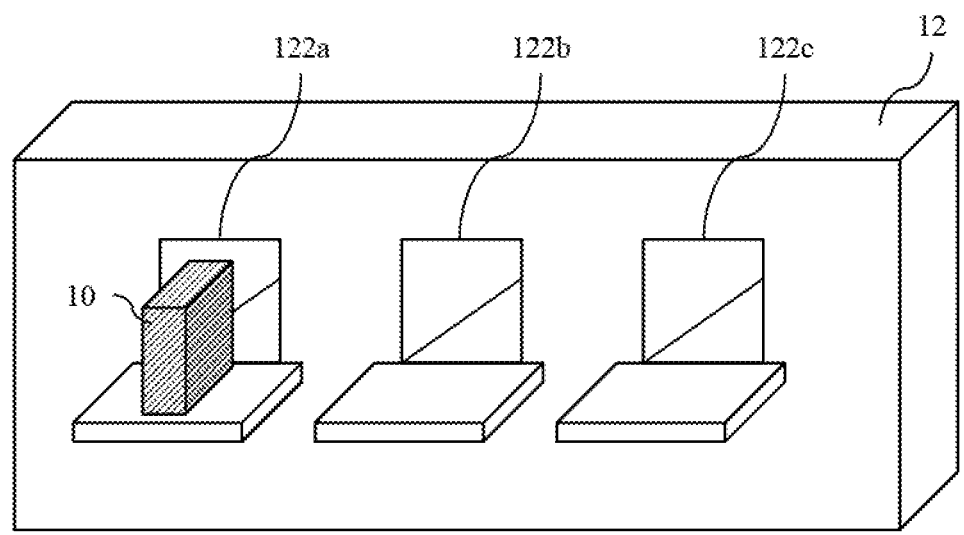
FIG. 8 is a perspective view of the charged particle beam device 1 according to a sixth embodiment.

FIG. 8 is a perspective view of the charged particle beam device 1 according to a sixth embodiment of the disclosure. In the sixth embodiment, the minien 12 includes a plurality of ports on which the FOUP 10 is placed when the FOUP 10 is transported into the minien 12. An example of FIG. 8 shows an example in which the minien 12 includes a port 122a, a port 122b, and a port 122c. Other configurations are the same as those of the first to fifth embodiments.

Since a movement path of the FOUP 10 is slightly different depending on through which port the FOUP 10 is introduced into the minien 12, it may be necessary to finely adjust a time point at which a sample starts to be taken out from the FOUP 10. In such a case, the transport control unit 24 may set a take-out start time point for each port after taking a movement path difference into consideration. Accordingly, even when the plurality of ports are provided as shown in FIG. 8, the take-out start time point can be set accurately.

Modifications of Disclosure

The disclosure is not limited to the embodiments described above, and has various modifications. For example, the embodiments described above have been described in detail for easy understanding of the disclosure, and the invention is not necessarily limited to those including all the configurations described above. A part of a configuration of an embodiment may be replaced with a configuration of another embodiment, or the configuration of another embodiment may be added to the configuration of the embodiment. A part of the configuration of each embodiment can be added to, deleted from, or replaced with another configuration.

The charged particle beam device according to the disclosure broadly includes a device that transports a sample from the FOUP 10 to the SC 17 via the LC 15. Examples of the charged particle beam device include an inspection device using a scanning electron microscope or a scanning ion microscope, a review device, a pattern measurement device, a sample processing device, a sample analysis device, and the like.

The recipe storage unit 21 and the processing time storage unit 22 can be configured with a storage device such as a hard disk. Other functional units provided in the computer system 20 can be configured with hardware such as a circuit device that implements functions thereof, or be configured by executing software that implements the functions by an arithmetic device such as a central processing unit (CPU).

Further, in functions, operations, processings, and flows of each of the above-described embodiments, each element and each step have been mainly described with the "computer system" or various "control units" as a subject (operation subject). However, the description may be made with the terms "computer system" and "control unit" being interchanged in terms of the subject (operation subject), or the description may be made using "various programs" executed by the computer system as the subject (operation subject). A part or all of the programs may be implemented by dedicated hardware, or may be modularized. Various programs may be installed in a computer system by a program distribution server or a storage medium.

REFERENCE SIGN LIST

1 charged particle beam device
10 FOUP
12 minien
121 atmospheric robot
13 main body
14 atmospheric door
15 LC
151 sample table
152 vacuum device
16 vacuum door
17 SC
171 vacuum robot
172 stage
20 computer system
21 recipe storage unit
22 processing time storage unit
23 recipe processing unit
231 recipe execution unit
232 recipe processing time prediction unit
233 LC transport time prediction unit
24 transport control unit
241 atmospheric robot control unit
242 vacuum device control unit
243 vacuum robot control unit
25 control unit

The invention claimed is:

1. A charged particle beam device configured to irradiate a sample with a charged particle beam, the charged particle beam device comprising:
    a sample chamber configured to accommodate the sample when the sample is irradiated with the charged particle beam;
    a load lock chamber configured to temporarily accommodate the sample when the sample is taken in and taken out of the sample chamber; and
    a computer system configured to control an operation of the charged particle beam device, wherein
    the computer system includes:
        a transport control unit that takes out the sample from a container that accommodates the sample, and controls a transport device that transports the sample between the sample chamber and the load lock chamber; and
        a recipe processing unit that executes a recipe describing a procedure for processing the sample by irradiating the sample with the charged particle beam,
    the recipe processing unit calculates a predicted completion time point at which the recipe is predicted to be completed,
    the recipe processing unit further predicts a load lock chamber movement time required from when the transport device starts to take out the sample from the container to when the sample is placed in the load lock chamber and an atmospheric door of the load lock chamber is closed, and a load lock chamber exhaustion time required to evacuate the load lock chamber when the load lock chamber accommodates the container, and
    by setting a time point at which the load lock chamber movement time and the load lock chamber exhaustion time are traced back from the predicted completion time point for a first sample or a time point before the time point as a take-out start time point at which a second sample is started to be taken out from the container, the transport control unit transports the first sample from the sample the second sample from the load lock chamber to the sample chamber in parallel after the recipe processing unit completes executing the recipe for the first sample.

2. The charged particle beam device according to claim 1, wherein
    the computer system includes a processing time storage unit that stores processing time data describing a required processing time of a processing specified in the recipe,
    the recipe is configured so that a processing to be executed and a processing not to be executed can be selected in accordance with a setting parameter, when executing the recipe, the recipe processing unit specifies processings to be executed and processings not to be executed in accordance with the setting parameter, and the recipe processing unit calculates the predicted completion time point by reading processing times of the specified processings to be executed from the processing time data and summing the processing times.

3. The charged particle beam device according to claim 1, wherein the recipe processing unit specifies in advance all processings to be executed when the recipe is executed, required processing times thereof, and an execution order, and calculates the predicted completion time point by summing the required processing times, by summing the required processing times while tracing the specified processings back from the predicted completion time point in a reverse order of the execution order, the recipe processing unit specifies a time point at which a total value of the required processing times is equal to or greater than a sum of the load lock chamber movement time and the load lock chamber exhaustion time as a specific time point, the recipe processing unit specifies a processing from which the recipe is scheduled to be started or scheduled to be during execution at the specific time point as a specific processing in accordance with the required processing times and the execution order, and the transport control unit starts to take out the second sample from the container when the recipe processing unit starts the specific processing.

4. The charged particle beam device according to claim 3, wherein even when a completion time point of any of the processings is changed after the recipe processing unit starts to execute the recipe, the transport control unit starts to take out the second sample from the container when the recipe processing unit starts the specific processing.

5. The charged particle beam device according to claim 1, wherein the recipe processing unit specifies in advance all processings to be executed when the recipe is executed, required processing times thereof, and an execution order, by summing the required processing times while tracing from a last processing to be executed in the execution order in a reverse order, the recipe processing unit specifies a time point at which a total value of the required processing times is equal to or greater than a sum of the load lock chamber movement time and the load lock chamber exhaustion time as a specific time point, the recipe processing unit specifies a processing from which the recipe is scheduled to be started or scheduled to be during execution at the specific time point as a specific processing in accordance with the required processing times and the execution order, and the transport control unit starts to take out the second sample from the container when the recipe processing unit starts the specific processing.

6. The charged particle beam device according to claim 1, wherein the recipe processing unit specifies in advance all processings to be executed when the recipe is executed, required processing times thereof, and an execution order, and calculates the predicted completion time point by summing the required processing times, when a processing to be executed when the recipe is executed is changed after the recipe is started to be executed, the recipe processing unit specifies again all processings to be executed, required processing times thereof, and an execution order after the change, and recalculates the predicted completion time point by summing the required processing times, the transport control unit resets the take-out start time point in accordance with the recalculated predicted completion time point.

7. The charged particle beam device according to claim 6, wherein the recipe processing unit recalculates the predicted completion time point in a period from when the processing to be executed when the recipe is executed is changed after the recipe is started to be executed to when a next processing is started.

8. The charged particle beam device according to claim 6, wherein the recipe specifies an automatic execution processing which is automatically executed by the recipe processing unit and a manual execution processing which is manually executed by a user, and the recipe processing unit recalculates the predicted completion time point each time the manual execution processing is completed.

9. The charged particle beam device according to claim 1, wherein the computer system includes a processing time storage unit that stores processing time data describing a required processing time of a processing specified in the recipe, the recipe processing unit executes the recipe, measures a processing time required for each of the processings during the execution, and writes a measurement result thereof in the processing time data, and the recipe processing unit calculates the predicted completion time point in accordance with the required processing time described in the processing time data.

10. The charged particle beam device according to claim 1, wherein a first recipe specifies that the load lock chamber exhaust time requires a first time, a second recipe specifies that the load lock chamber exhaust time requires a second time, the recipe processing unit, when executing the first recipe for the second sample, sets the take-out start time point using the first time, and the recipe processing unit, when executing the second recipe for the second sample, sets the take-out start time point using the second time.

11. The charged particle beam device according to claim 1, further comprising:

two or more ports configured to place the container thereon when the transport device takes out the sample from the container, wherein the transport control unit sets the take-out start time point for each port.

12. A charged particle beam device configured to irradiate a sample with a charged particle beam, the charged particle beam device comprising:

a sample chamber configured to accommodate the sample when the sample is irradiated with the charged particle beam;

a load lock chamber configured to temporarily accommodate the sample when the sample is taken in and taken out of the sample chamber; and a computer system configured to control an operation of the charged particle beam device, wherein the computer system includes: accommodates the sample, and controls a transport device that transports the sample between the sample chamber and the load lock chamber; and a recipe processing unit that executes a recipe describing a procedure for processing the sample by irradiating the sample with the charged particle beam, the recipe processing unit predicts a load lock chamber movement time required from when the transport device starts to take out the sample from the container to when the sample is placed in the load lock chamber and an atmospheric door of the load lock chamber is closed, and a load lock chamber exhaustion time required to evacuate the load lock chamber when the load lock chamber accommodates the container, the recipe processing unit specifies in advance all processings to be executed when the recipe is executed, required processing times thereof, and an execution order, by summing the required processing times while tracing from a last processing to be executed in the execution order in a reverse order, the recipe processing unit specifies a time point at which a total value of the required processing times is equal to or greater than a sum of the load lock chamber movement time and the load lock chamber exhaustion time as a specific time point, the recipe processing unit specifies a processing scheduled to be started or scheduled to be during execution at the specific time point as a specific processing in accordance with the required processing times and the execution order, and by starting to take out a second sample from the container when the recipe processing unit starts the specific processing for a first sample, the transport control unit transports the first sample from the sample chamber to the load lock chamber and transports the second sample from the load lock chamber to the sample chamber in parallel after the recipe processing unit completes executing the recipe for the first sample.

\* \* \* \* \*